(12) United States Patent
Kwon

(10) Patent No.: US 9,653,372 B2
(45) Date of Patent: May 16, 2017

(54) METHOD FOR FABRICATING FAN-OUT WAFER LEVEL PACKAGE AND FAN-OUT WAFER LEVEL PACKAGE FABRICATED THEREBY

(71) Applicant: SAMSUNG ELECTRONICS CO., LTD., Suwon-si, Gyeonggi-Do (KR)

(72) Inventor: Yonghwan Kwon, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/824,394

(22) Filed: Aug. 12, 2015

(65) Prior Publication Data

US 2016/0118326 A1  Apr. 28, 2016

(51) Int. Cl.
*H01L 21/00* (2006.01)
*H01L 23/31* (2006.01)
(Continued)

(52) U.S. Cl.
CPC ........ *H01L 23/3114* (2013.01); *H01L 21/486* (2013.01); *H01L 21/4853* (2013.01); *H01L 21/563* (2013.01); *H01L 21/566* (2013.01); *H01L 21/568* (2013.01); *H01L 23/5383* (2013.01); *H01L 23/5384* (2013.01); *H01L 23/5389* (2013.01); *H01L 24/24* (2013.01); *H01L 24/73* (2013.01); *H01L 24/82* (2013.01); *H01L 24/92* (2013.01); *H01L 24/96* (2013.01); *H01L 25/065* (2013.01); *H01L 2224/04105* (2013.01); *H01L 2224/0557* (2013.01); *H01L 2224/12105* (2013.01); *H01L 2224/16145* (2013.01); *H01L 2224/16146* (2013.01); *H01L 2224/24137* (2013.01); *H01L 2224/24146* (2013.01); *H01L 2224/32145* (2013.01); *H01L 2224/32225* (2013.01); *H01L 2224/73204* (2013.01); *H01L 2224/73209* (2013.01); *H01L 2224/73253* (2013.01); *H01L 2224/73259* (2013.01); *H01L 2224/73267* (2013.01);
(Continued)

(58) Field of Classification Search
CPC ... H01L 21/563; H01L 21/568; H01L 21/566; H01L 24/82; H01L 2224/04105; H01L 2224/32145; H01L 21/6835; H01L 2224/82; H01L 2225/06541; H01L 2225/06548
See application file for complete search history.

(56) References Cited

U.S. PATENT DOCUMENTS 7,759,246 B2  7/2010  Matsuki et al.
8,227,927 B2  7/2012  Chen et al.
(Continued)

*Primary Examiner* — Khiem D Nguyen
(74) *Attorney, Agent, or Firm* — F. Chau & Associates, LLC

(57) ABSTRACT

A method for fabricating a fan-out wafer level package includes disposing a first semiconductor chip on a dummy substrate, forming a mold substrate on the first semiconductor chip and the dummy substrate, removing the dummy substrate to expose the first semiconductor chip, disposing a second semiconductor chip on the exposed first semiconductor chip, forming an insulating layer on the second semiconductor chip, the first semiconductor chip, and the mold substrate, and forming a plurality of redistribution lines that electrically connects the first semiconductor chip and the second semiconductor chip through the insulating layer.

18 Claims, 18 Drawing Sheets

(51) Int. Cl.
　　　*H01L 21/48*　　　(2006.01)
　　　*H01L 21/56*　　　(2006.01)
　　　*H01L 23/00*　　　(2006.01)
　　　*H01L 23/538*　　(2006.01)
　　　*H01L 25/065*　　(2006.01)
(52) U.S. Cl.
　　　CPC ............... *H01L 2224/81005* (2013.01); *H01L 2224/92124* (2013.01); *H01L 2224/92224* (2013.01); *H01L 2224/92225* (2013.01); *H01L 2224/92244* (2013.01)

(56)　　　　　　　References Cited

U.S. PATENT DOCUMENTS

| | | | |
|---|---|---|---|
| 8,531,032 B2 | 9/2013 | Yu et al. | |
| 8,736,076 B2 | 5/2014 | Hawk | |
| 2006/0231958 A1* | 10/2006 | Yang | H01L 23/5389 257/777 |
| 2009/0134528 A1 | 5/2009 | Lee et al. | |
| 2009/0146281 A1 | 6/2009 | Jung | |
| 2010/0193930 A1 | 8/2010 | Lee | |
| 2011/0037169 A1* | 2/2011 | Pagaila | H01L 21/561 257/737 |
| 2011/0233795 A1 | 9/2011 | Kim et al. | |
| 2013/0147063 A1 | 6/2013 | Park et al. | |
| 2013/0295725 A1* | 11/2013 | Park | H01L 24/19 438/124 |

* cited by examiner

METHOD FOR FABRICATING FAN-OUT WAFER LEVEL PACKAGE AND FAN-OUT WAFER LEVEL PACKAGE FABRICATED THEREBY

CROSS-REFERENCE TO RELATED APPLICATIONS

This application claims priority under 35 U.S.C. §119 to Korean Patent Application No. 10-2014-0144419, filed on Oct. 23, 2014, the disclosure of which is incorporated by reference herein in its entirety.

TECHNICAL FIELD

Exemplary embodiments of the present inventive concept relate to a method for fabricating a fan-out wafer level package and a fan-out wafer level package fabricated thereby.

DISCUSSION OF THE RELATED ART

As semiconductor chips become highly integrated, sizes of the semiconductor chips have been reduced. A distance between solder balls disposed on the semiconductor chip may be determined by an international standard of the World Semiconductor Council. Thus, it may be difficult to control the number of solder balls of the semiconductor chip. In addition, as the size of semiconductor chips has been reduced, performing testing on the semiconductor chips has become more difficult. Further, various boards are required to mount variously-sized semiconductor chips.

SUMMARY

Exemplary embodiments of the present inventive concept provide a method for fabricating a fan-out wafer level package capable of realizing a multi-chip with reduced (e.g., minimized) thickness and size.

Exemplary embodiments of the inventive concept further provide a fan-out wafer level package capable of reducing (e.g., minimizing) a total thickness of a plurality of stacked semiconductor chips.

According to an exemplary embodiment, a method for fabricating a fan-out wafer level package includes disposing a first semiconductor chip on a dummy substrate, forming a mold substrate on the first semiconductor chip and the dummy substrate, removing the dummy substrate to expose the first semiconductor chip, disposing a second semiconductor chip on the exposed first semiconductor chip, forming an insulating layer on the second semiconductor chip, the first semiconductor chip, and the mold substrate, and forming a plurality of redistribution lines. The plurality of redistribution lines electrically connects the first semiconductor chip and the second semiconductor chip through the insulating layer.

In an exemplary embodiment, the method further includes forming a separation layer on the dummy substrate, and removing the dummy substrate includes removing the separation layer from the mold substrate and the first semiconductor chip.

In an exemplary embodiment, the separation layer includes a temporary adhesive, and the method further includes heating the temporary adhesive to separate the temporary adhesive from the first semiconductor chip and the mold substrate.

In an exemplary embodiment, the first semiconductor chip includes a first device substrate, a first passivation layer disposed on the first device substrate, and a plurality of first device pads connected to the first device substrate and exposed through the first passivation layer. The separation layer is temporarily adhered to the plurality of first device pads and the first passivation layer.

In an exemplary embodiment, the method further includes disposing an adhesive layer between the second semiconductor chip and the first passivation layer.

In an exemplary embodiment, the first semiconductor chip includes a first through-electrode and a first electrode pad, and the method further includes forming a third semiconductor chip aligned with the first electrode pad. A first end of the first through-electrode is connected to one of the plurality of first device pads, the first through-electrode penetrates the first device substrate, and the first electrode pad is connected to a second end of the first through-electrode that is opposite to the first end.

In an exemplary embodiment, the third semiconductor chip includes a third device substrate, a third passivation layer, and a third device pad, and the method further includes forming a first underfill layer between the third passivation layer and the first device substrate. The third passivation layer is disposed on the third device substrate, and the third device pad penetrates the third passivation layer and electrically connects the third device substrate to the first electrode pad.

In an exemplary embodiment, the second semiconductor chip includes a second device substrate, a second passivation layer, a plurality of second device pads, a second through-electrode, and a second electrode pad, and the method further includes forming an underfill layer between the first passivation layer and the second device substrate. The second passivation layer is disposed on the second device substrate, the plurality of second device pads is connected to the second device substrate and exposed through the second passivation layer, a first end of the second through-electrode is connected to one of the plurality of second device pads, the second through-electrode penetrates the second device substrate, the second electrode pad is electrically connected to a second end of the second through-electrode that is opposite to the first end, and the second electrode pad electrically connects the second through-electrode to the first device pad.

According to an exemplary embodiment, a fan-out wafer level package includes a first semiconductor chip, a mold substrate surrounding a first (e.g., bottom) surface and a sidewall of the first semiconductor chip, a second semiconductor chip disposed on the first semiconductor chip, an insulating layer covering the second semiconductor chip, the first semiconductor chip, and the mold substrate, a plurality of redistribution lines penetrating the insulating layer and electrically connecting the first semiconductor chip to the second semiconductor chip, and a plurality of external terminals disposed on the insulating layer and connected to the plurality of redistribution lines.

In an exemplary embodiment, the first semiconductor chip includes a first device substrate, a first passivation layer disposed on the first device substrate, and a plurality of first device pads penetrating the first passivation layer and connected to the first device substrate. A top surface of the first passivation layer, top surfaces of the first device pads, and a top surface of the mold substrate are substantially aligned with one another.

In an exemplary embodiment, the second semiconductor chip includes a second device substrate, a second passivation layer disposed on the second device substrate, and a plurality of second device pads connected to the second device substrate and exposed through the second passivation layer. The plurality of first device pads do not overlap the second device substrate.

In an exemplary embodiment, the fan-out wafer level package further includes an adhesive layer disposed between the first passivation layer and the second device substrate.

In an exemplary embodiment, the fan-out wafer level package includes a third semiconductor chip aligned with the first semiconductor chip and disposed within the mold substrate, and the first semiconductor chip further includes a first through-electrode penetrating the first device substrate and having a first end connected to one of the plurality of first device pads, and a first electrode pad connected to a second end of the first through-electrode opposite to the first end, and connected to the third semiconductor chip.

In an exemplary embodiment, the fan-out wafer level package includes a first underfill layer disposed between the third semiconductor chip and the first device substrate, and the third semiconductor chip includes a third device substrate, a third passivation layer disposed between the third device substrate and the first underfill layer, and a third device pad penetrating the third passivation layer and electrically connecting the third device substrate to the first electrode pad.

In an exemplary embodiment, the fan-out wafer level package further includes an underfill layer disposed between the first passivation layer and the second semiconductor chip, and the second semiconductor chip includes a second device substrate disposed on the underfill layer, a second passivation layer disposed on the second device substrate, a plurality of second device pads connected to the second device substrate and exposed through the second passivation layer, a second through-electrode penetrating the second device substrate and connected to one of the plurality of second device pads, and a second electrode pad disposed between the second through-electrode and the one of the plurality of second device pads.

According to an exemplary embodiment, a fan-out wafer level package includes a first semiconductor chip including a first device substrate, a first passivation layer disposed on the first device substrate, and a plurality of first device pads penetrating the first passivation layer and connected to the first device substrate, a mold substrate surrounding a first surface and a sidewall of the first semiconductor chip, a second semiconductor chip disposed on the first semiconductor chip and including a second device substrate, a second passivation layer disposed on the second device substrate, and a plurality of second device pads connected to the second device substrate and exposed through the second passivation layer, an insulating layer covering the second semiconductor chip, the first semiconductor chip, and the mold substrate, and a plurality of redistribution lines penetrating the insulating layer and electrically connecting the first semiconductor chip to the second semiconductor chip. The second device substrate overlaps the first passivation layer and does not overlap the plurality of first device pads.

According to an exemplary embodiment, a method for fabricating a fan-out wafer level package includes forming a separation layer on a dummy substrate, disposing a first semiconductor chip on the separation layer, forming a mold substrate on the first semiconductor chip and the separation layer, removing the separation layer and the dummy substrate to expose the first semiconductor chip, disposing a second semiconductor chip on the exposed first semiconductor chip, forming an insulating layer on the second semiconductor chip, the first semiconductor chip, and the mold substrate, and forming redistribution lines that penetrate the insulating layer and electrically connect the first semiconductor chip to the second semiconductor chip.

BRIEF DESCRIPTION OF THE DRAWINGS

Exemplary embodiments of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
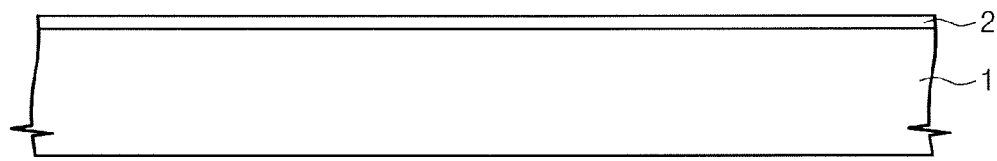
FIGS. 1 to 9 are cross-sectional views illustrating a method for fabricating a fan-out wafer level package according to an exemplary embodiment of the present inventive concept.

Exemplary embodiments of the present inventive concept will be described more fully hereinafter with reference to the accompanying drawings. In the drawings, the thickness and sizes of layers, films, panels, regions, etc., may be exaggerated for clarity. Like reference numerals may refer to like elements throughout the accompanying drawings.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present.

Additionally, the exemplary embodiments in the detailed description may be described with sectional views as ideal exemplary views of the inventive concept. Accordingly, shapes of the exemplary views may be modified according to manufacturing techniques and/or allowable errors. Therefore, the exemplary embodiments of the inventive concept are not limited to the specific shapes illustrated in the exemplary views, but may include other shapes that may be created according to manufacturing processes.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, may occur. Thus, exemplary embodiments should not be construed as limited to the shapes of regions illustrated herein but are to include deviations in shapes that result, for example, from manufacturing.

Devices and methods of forming devices according to various exemplary embodiments described herein may be embodied in microelectronic devices such as, for example, integrated circuits, wherein a plurality of devices according to various exemplary embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary embodiments described herein may include a plurality of the devices in an array and/or in a two-dimensional pattern that is based on the functionality of the microelectronic device.

The devices according to various exemplary embodiments described herein may be interspersed among other devices depending on the functionality of the microelectronic device. Moreover, microelectronic devices according to various exemplary embodiments described herein may be replicated in a third direction that may be orthogonal to the two different directions, to provide three-dimensional integrated circuits.

Accordingly, the cross-sectional view(s) illustrated herein provide support for a plurality of devices according to various exemplary embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It is to be understood that when a process or element is described herein with reference to a plurality of semiconductor chips (e.g., a plurality of first semiconductor chips, second semiconductor chips, or third semiconductor chips), the process or element may also refer to a single one of the plurality of semiconductor chips (e.g., one of the plurality of first semiconductor chips, second semiconductor chips, or third semiconductor chips).

FIGS. 1 to 9 are cross-sectional views illustrating a method for fabricating a fan-out wafer level package according to an exemplary embodiment of the present inventive concept.

Referring to FIG. 1, a separation layer 2 may be formed on a dummy substrate 1. The dummy substrate 1 may include, for example, a glass substrate. The separation layer 2 may include, for example, a temporary adhesive. For example, the separation layer 2 may include a dual-curing silicon modified adhesive.

Figure 2:
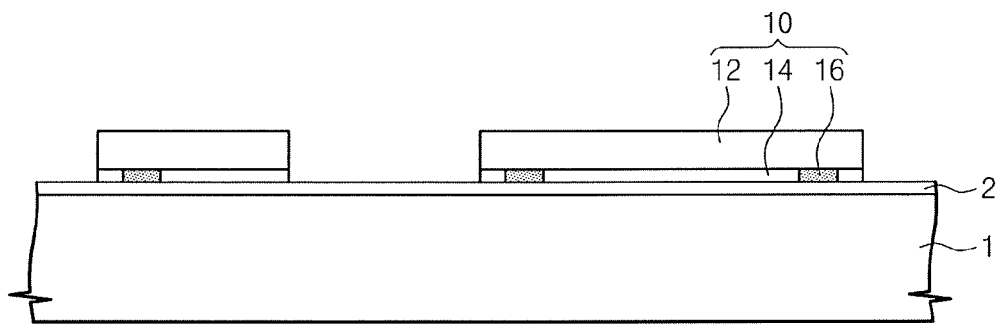

Referring to FIG. 2, first semiconductor chips 10 may be disposed on the separation layer 2. The separation layer 2 may bond the first semiconductor chips 10 to the dummy substrate 1. Each of the first semiconductor chips 10 may include a first device substrate 12, a first passivation layer 14, and first device pads 16. The first device substrate 12 may include a plurality of unit elements. The unit elements may include, for example, at least one of a memory element, a logic element, or a control element. The first passivation layer 14 may be disposed on the first device substrate 12. The first device pads 16 may penetrate the first passivation layer 14 so as to be connected to the first device substrate 12. For example, the first device pads 16 may be electrically connected to the unit elements of the first device substrate 12. The first passivation layer 14 and the first device pads 16 may be disposed on the first device substrate 12. The first semiconductor chips 10 may be disposed in a plurality of orientations. The first passivation layer 14 and the first device pads 16 may be adhered to the separation layer 2.

Figure 3:
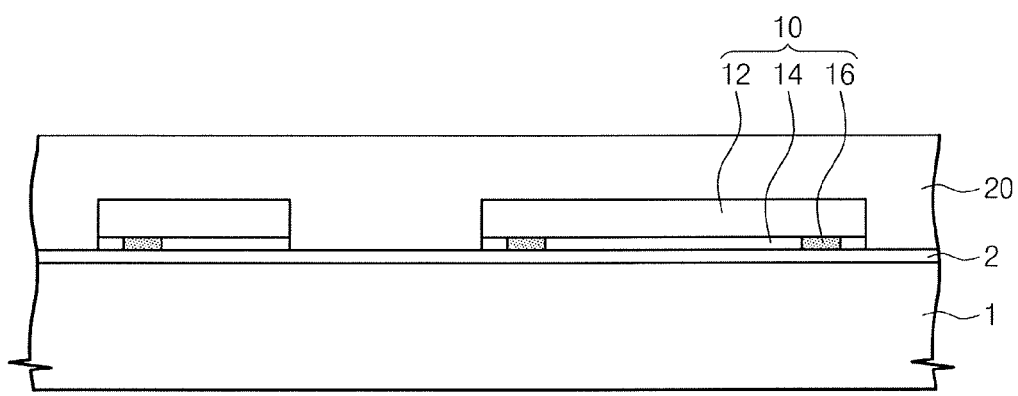

Referring to FIG. 3, a mold substrate 20 may be formed on the first semiconductor chips 10 and the dummy substrate 1. The mold substrate 20 may include, for example, an epoxy molding compound. The mold substrate 20 may be molded so as to surround a portion of the first semiconductor chips 10. For example, referring to one of the first semiconductor chips 10, the mold substrate 20 may surround a first surface (e.g., a bottom surface) and sidewalls of the first semiconductor chip 10, and may expose a second surface (e.g., a top surface) opposing the first surface of the first semiconductor chip 10.

Figure 4:
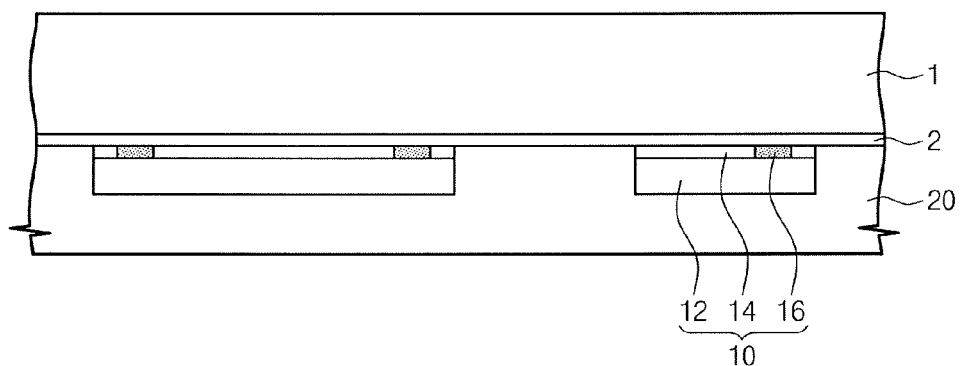

Referring to FIG. 4, the resulting structure having the mold substrate 20 of FIG. 3 may be turned over, such that the dummy substrate 1 is disposed on the mold substrate 20. Alternatively, during the fabrication process, the separation layer 2 may be formed on a bottom surface of the dummy substrate 1, the first semiconductor chips 10 may be bonded to a bottom surface of the separation layer 2, and the mold substrate 20 may be formed on bottom surfaces and sidewalls of the first semiconductor chips 10 and the bottom surface of the separation layer 2.

Figure 5:
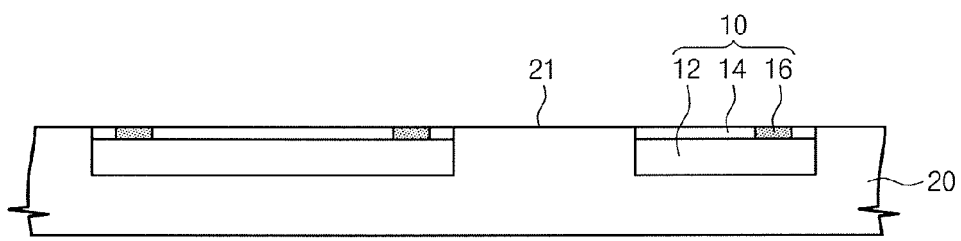

Referring to FIG. 5, the dummy substrate 1 and the separation layer 2 may be removed to expose the first semiconductor chips 10. In exemplary embodiments, the separation layer 2 may be heated to be separated from the first semiconductor chips 10 and the mold substrate 20. For example, in an exemplary embodiment in which the separation layer 2 includes a temporary adhesive, the temporary adhesive may be heated to separate the temporary adhesive from the first semiconductor chips 10 and the mold substrate 20. The heated separation layer 2 may lose adhesive strength. The first device substrate 12 may be disposed in the mold substrate 20. The first passivation layer 14 and the first device pads 16 may be disposed such that a top surface of the first passivation layer 14, top surfaces of the first device pads 16, and a top surface 21 of the mold substrate 20 are substantially aligned with one another. For example, the height of the top surface of the first passivation layer 14 and the height of the top surfaces of the first device pads 16 may be about the same as the height of a top surface 21 of the mold substrate 20. That is, the top surface of the first passivation layer 14 and the top surfaces of first device pads 16 may be coplanar with the top surface 21 of the mold substrate 20 such that the top surface of the first passivation layer 14 and the top surfaces of the first device pads 16 do not extend beyond the top surface 21 of the mold substrate 20 and are not recessed below the top surface 21 of the mold substrate 20.

Figure 6:
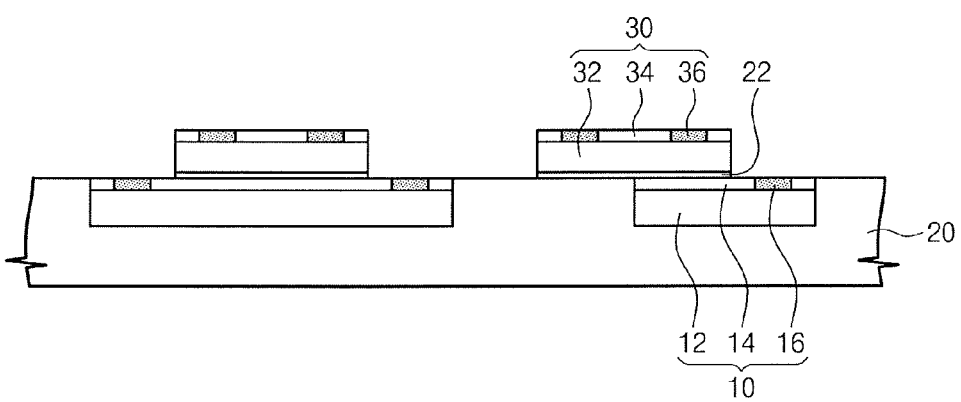

Referring to FIG. 6, adhesive layers 22 and second semiconductor chips 30 may be disposed on the first semiconductor chips 10, which are exposed via a side of the mold substrate 20 once the separation layer 2 has been removed. In an exemplary embodiment, the second semiconductor chips 30 may be disposed such that they overlap the first device substrates 12 and the first passivation layers 14 of the first semiconductor chips 10, but do not overlap the first device pads 16 of the first semiconductor chips, as shown in FIG. 6. Each of the adhesive layers 22 may be disposed between each of the first semiconductor chips 10 and each of the second semiconductor chips 30. Each adhesive layer 22 may include, for example, a die attachment film. Each of the second semiconductor chips 30 may include a second device substrate 32, a second passivation layer 34, and second device pads 36. The second passivation layer 34 and the second device pads 36 may be formed on the second device substrate 32. In an exemplary embodiment, the second device substrate 32 of the second semiconductor chips 30 may be smaller than the first device substrate 12 of the first semiconductor chips 10. In an exemplary embodiment, the second device substrate 32 may partially overlap the first device substrate 12. The adhesive layer 22 may be disposed between the second device substrate 32 and the first passivation layer 14 of the first semiconductor chips 10. In an exemplary embodiment, a portion of the adhesive layer 22 may be disposed between the mold substrate 20 and the second device substrate 32, and the first device pads 16 do not overlap the second device substrate 32 and the adhesive layer 22. According to exemplary embodiments, the size of chips from among the first semiconductor chips 10 may be substantially the same or may vary, as shown in FIG. 6. Further, according to exemplary embodiments, the first semiconductor chips 10 of a fan-out wafer level package may include both chips having substantially the same size as well as different sized chips.

Figure 7:
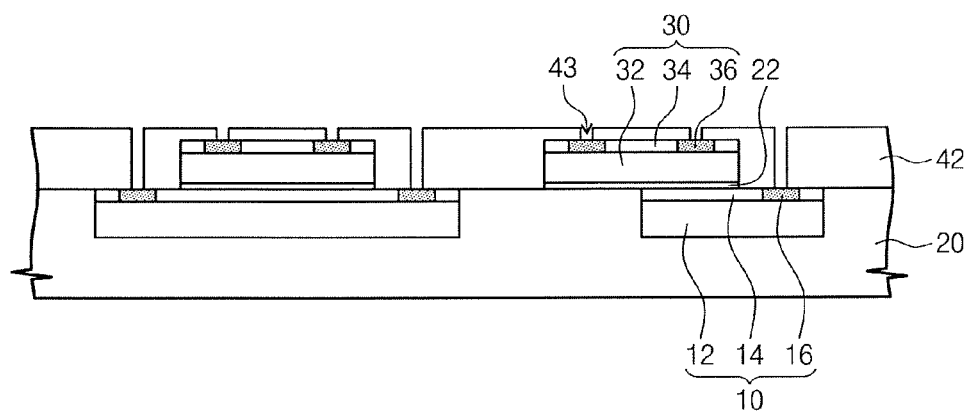

Referring to FIG. 7, a first insulating layer 42 may be formed on the mold substrate 20, the first semiconductor chips 10, and the second semiconductor chips 30. The first insulating layer 42 may include, for example, a polymer or a dielectric layer. The first insulating layer 42 may be formed, for example, by a vapor deposition method or a sol-gel method. The first insulating layer 42 may have contact holes 43. The first device pads 16 and the second device pads 36 may be exposed through the contact holes 43. In an exemplary embodiment, the first semiconductor chips 10 and the second semiconductor chips 30 between the mold substrate 20 and the first insulating layer 42 may correspond to a multi-chip having a reduced thickness (e.g., a minimized thickness) and a reduced size (e.g., a minimized size). The first insulating layer 42 may cover the first semiconductor chips 10, the second semiconductor chips 30, and the mold substrate 20.

Figure 8:
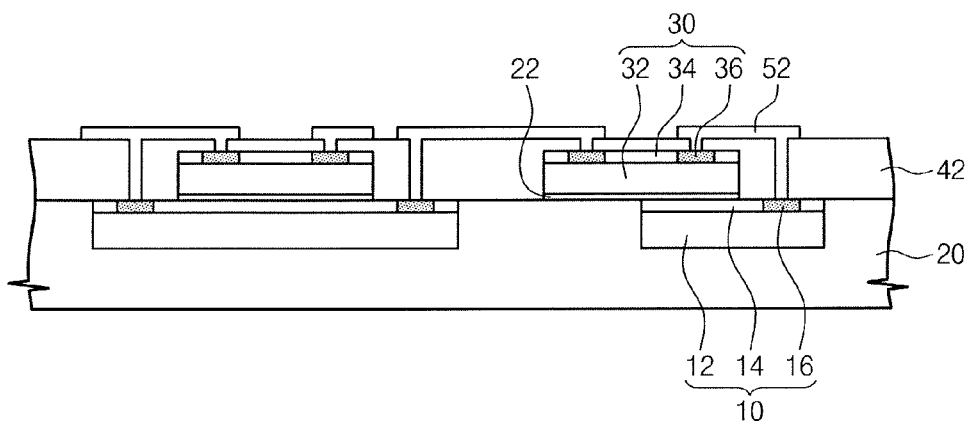

Referring to FIG. 8, first redistribution lines 52 may be formed on portions of the first insulating layer 42, the first device pads 16, and the second device pads 36. The first redistribution lines 52 may be formed, for example, by a process of forming a seed layer, a mask process, and an electroplating process. The seed layer may be formed by, for example, a sputtering process. The seed layer may be formed on the first insulating layer 42, the first device pads 16, and the second device pads 36. A mask pattern may be formed on the seed layer by the mask process. The mask pattern may expose portions of the seed layer. The exposed portions of the seed layer may define the first redistribution lines 52. That is, the exposed portions of the seed layer may have the same planar shapes as the first redistribution lines 52. The first redistribution lines 52 may be formed on the exposed portions of the seed layer by the electroplating process. The first redistribution lines 52 may be formed on the portions of the first insulating layer 42, the first device pads 16, and the second device pads 36. The first redistribution lines 52 may fill the contact holes 43. The first redistribution lines 52 may electrically connect the first device pads 16 to the second device pads 36. Thereafter, the mask pattern and the seed layer around the first redistribution lines 52 may be removed.

Figure 9:
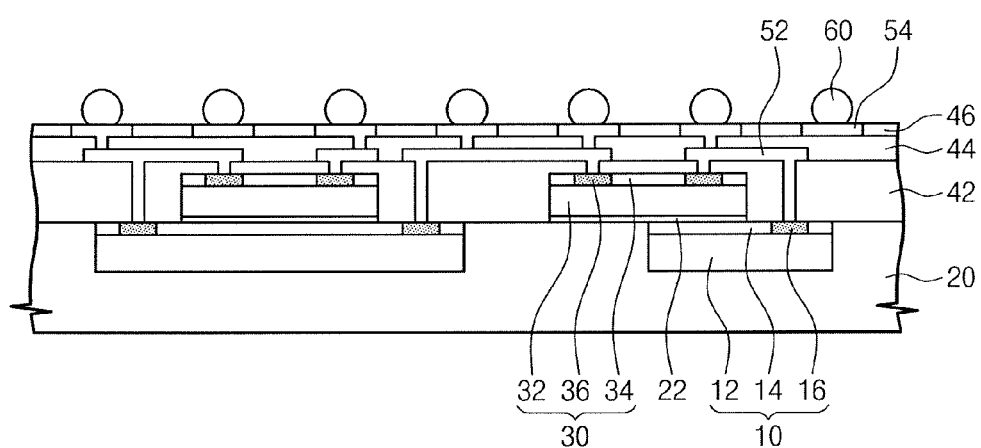

Referring to FIG. 9, a second insulating layer 44, second redistribution lines 54, a package passivation layer 46, and solder balls 60 may be formed on the first redistribution lines 52 and the first insulating layer 42. Herein, solder balls may also be referred to as external terminals. The second insulating layer 44 may be formed on the first redistribution lines 52 and the first insulating layer 42. The second insulating layer 44 may be formed by the same method as the first insulating layer 42. The second redistribution lines 54 may penetrate the second insulating layer 44 so as to be connected to the first redistribution lines 52. The package passivation layer 46 may be formed on portions of the second redistribution lines 54 and the second insulating layer 44. The package passivation layer 46 may selectively expose other portions of the second redistribution lines 54. The second redistribution lines 54 may be formed by the same method as the first redistribution lines 52. The solder balls 60 may be formed on the exposed portions of the second redistribution lines 54. The exposed portions of the second redistribution lines 54 may correspond to package pads.

FIGS. 10 to 17 are cross-sectional views illustrating a method for fabricating a fan-out wafer level package according to an exemplary embodiment of the present inventive concept. For convenience of explanation, a further description of elements and processes previously described with reference to FIGS. 1 to 9 may be omitted. In the exemplary embodiment of FIGS. 10 to 17, the first device pads may overlap the second device pads, as described further below.

Figure 10:
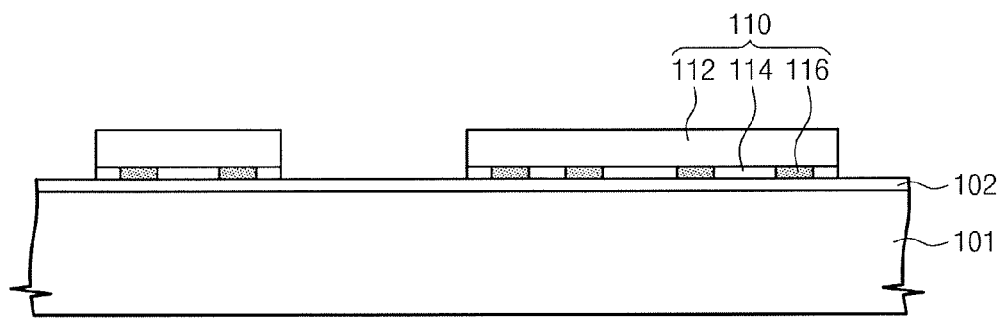
FIGS. 10 to 17 are cross-sectional views illustrating a method for fabricating a fan-out wafer level package according to an exemplary embodiment of the present inventive concept.
Figure 11:
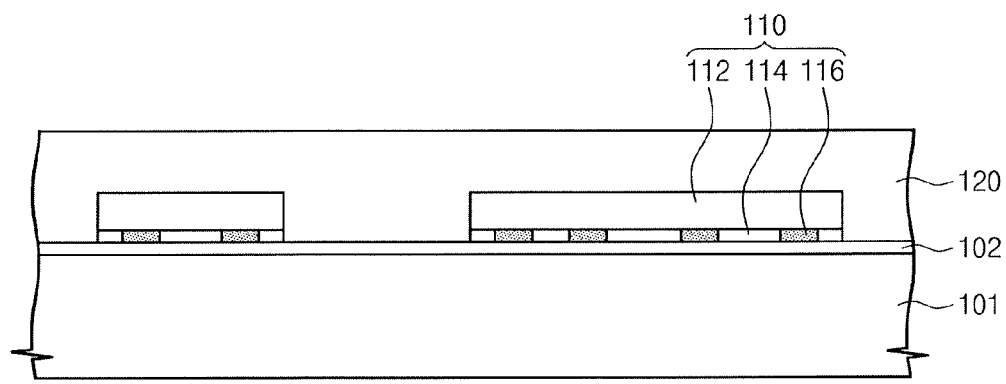

Referring to FIGS. 10 and 11, a separation layer 102 may be formed on a dummy substrate 101, and first semiconductor chips 110 and a mold substrate 120 may be formed on the dummy substrate 101. A first passivation layer 114 and first device pads 116 of the first semiconductor chips 110 may be adhered to the separation layer 102. The mold substrate 120 may be formed on the separation layer 102 and on the first device substrate 112 of the first semiconductor chips 110.

Figure 12:
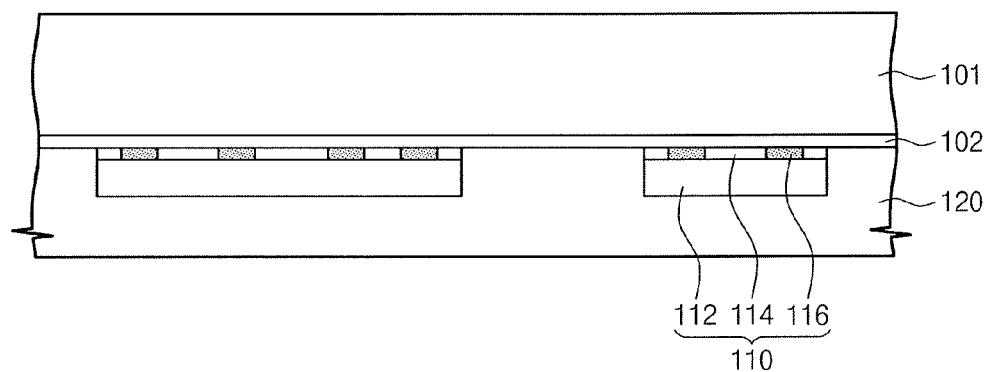

Referring to FIG. 12, the mold substrate 120 and the dummy substrate 101 may be turned over, such that the first semiconductor chips 110, the separation layer 102, and the dummy substrate 101 are disposed on the mold substrate 120.

Figure 13:
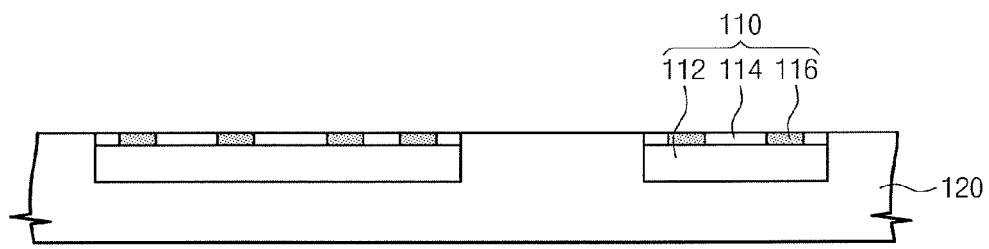

Referring to FIG. 13, the dummy substrate 101 and the separation layer 102 may be removed. The separation layer 102 may be separated from the first semiconductor chips 110 and the first passivation layers 114 using, for example, a heating process.

Figure 14:
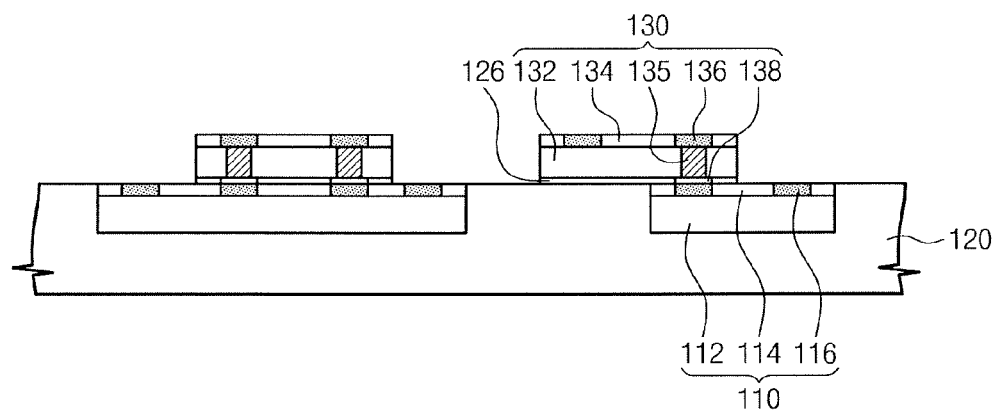

Referring to FIG. 14, second semiconductor chips 130 may be formed on the first semiconductor chips 110. The second semiconductor chips 110 may be electrically connected to the second semiconductor chips 130. Each of the second semiconductor chips 130 may include a second device substrate 132, a second passivation layer 134, second device pads 136, second through-electrodes 135, and second electrode pads 138. The second electrode pads 138 may be disposed on a bottom surface of the second device substrate 132. The second device pads 136 may be disposed on a top surface of the second device substrate 132. The second through-electrodes 135 may be disposed between the second electrode pads 138 and the second device pads 136. The second through-electrodes 135 may penetrate the second device substrate 132. The second through-electrodes 135 may electrically connect the second device pads 136 to the second electrode pads 138. For example, a first end of a second through-electrode 135 may be connected to a second device pad 136, and a second electrode pad 138 may be connected to a second end of the second through-electrode 135 that is opposite to the first end. The second electrode pads 138 may be bonded to the first device pads 116 of the first semiconductor chips 110. One or some of the first device pads 116 of the first semiconductor chips 110 may be disposed between the second device substrate 132 and the first device substrate 112 of the first semiconductor chips 110. Thus, according to exemplary embodiments, the position of the first device pads 116 may be determined regardless of a size of the second device substrate 132. A second underfill layer 126 may fill a space between the second device substrate 132 and the first passivation layer 114 of the first semiconductor chips 110. In exemplary embodiments, a portion of the second underfill layer 126 may be disposed between the second device substrate 132 and the mold substrate 120. The second underfill layer 126 may include, for example, a non-conductive film (NCF).

Figure 15:
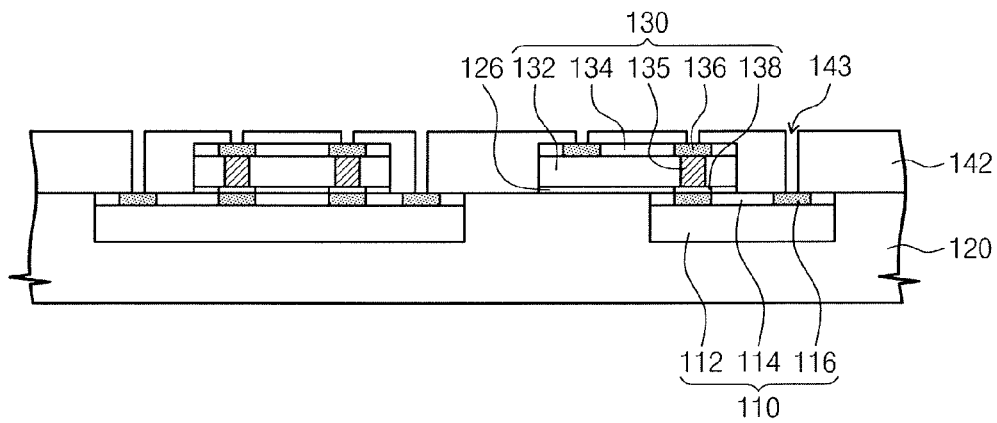

Referring to FIG. 15, a first insulating layer 142 may be formed on the mold substrate 120, the first semiconductor chips 110, and the second semiconductor chips 130. The first insulating layer 142 may have contact holes 143.

Figure 16:
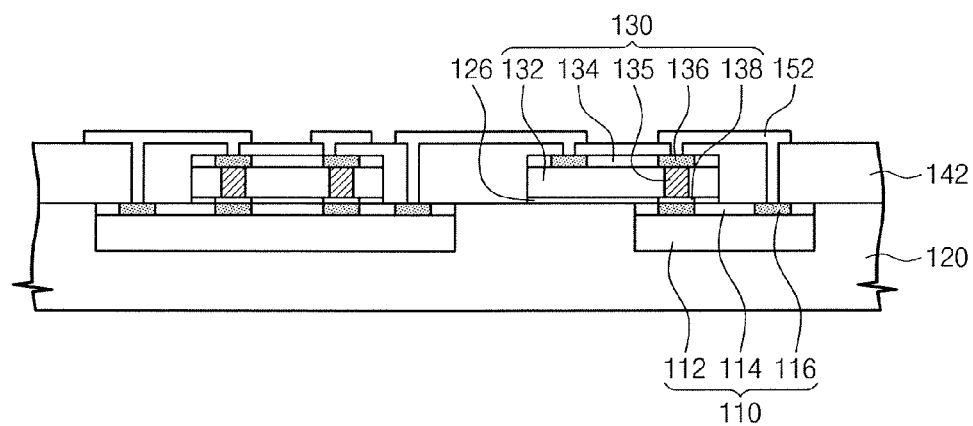

Referring to FIG. 16, first redistribution lines 152 may be formed on portions of the first insulating layer 142, the first device pads 116 of the first semiconductor chips 110, and the second device pads 136 of the second semiconductor chips 130. The first redistribution lines 152 may fill the contact holes 143. The first redistribution lines 152 may electrically connect the first device pads 116 to the second device pads 136.

Figure 17:
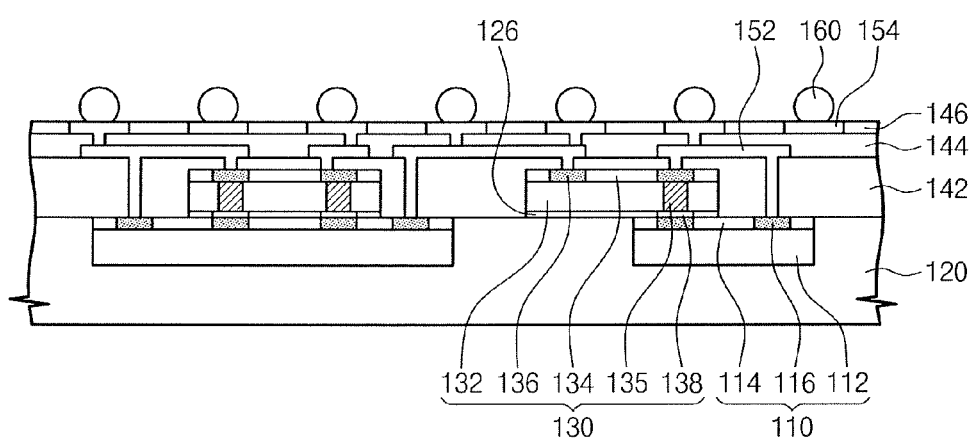

Referring to FIG. 17, a second insulating layer 144, second redistribution lines 154, a package passivation layer 146, and solder balls 160 may be sequentially formed on the first redistribution lines 152 and the first insulating layer 142. The second insulating layer 144 and the second redistribution lines 154 may be formed by the same methods as the first insulating layer 142 and the first redistribution lines 152, respectively. The package passivation layer 146 may be formed on portions of the second redistribution lines 154 and the second insulating layer 144. The solder balls 160 may be formed on exposed portions of the second redistribution lines 154.

FIGS. 18 to 25 are cross-sectional views illustrating a method for fabricating a fan-out wafer level package according to an exemplary embodiment of the present inventive concept. For convenience of explanation, a further description of elements and processes previously described with reference to FIGS. 1 to 17 may be omitted. Compared to the exemplary embodiment of FIGS. 1 to 9, in the exemplary embodiment of FIGS. 18 to 25, an additional semiconductor chip may be disposed under the first semiconductor chip, as described further below.

Figure 18:
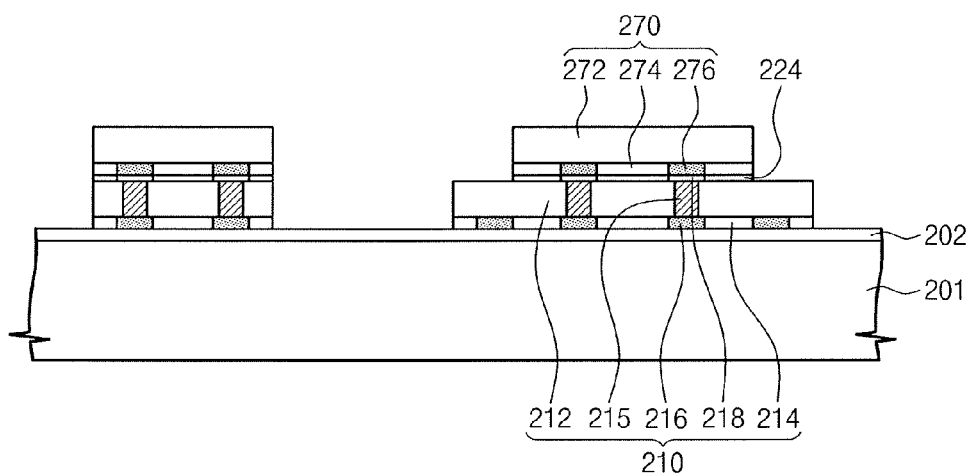
FIGS. 18 to 25 are cross-sectional views illustrating a method for fabricating a fan-out wafer level package according to an exemplary embodiment of the present inventive concept.

Referring to FIG. 18, a separation layer 202 may be formed on a dummy substrate 201, and first semiconductor chips 210 and third semiconductor chips 270 may be stacked on the separation layer 202. The third semiconductor chips 270 may be smaller than the first semiconductor chips 210. Alternatively, the third semiconductor chip 270 may be substantially the same size as the first semiconductor chips 210. Each of the first semiconductor chips 210 may include a first device substrate 212, a first passivation layer 214, first device pads 216, first through-electrodes 215, and first electrode pads 218. The first passivation layer 214 and the first device pads 216 may be bonded to the separation layer 202. The first through-electrodes 215 may penetrate the first device substrate 212 to electrically connect the first device pads 216 to the first electrode pads 218. For example, a first end of a first through-electrode 215 may be connected to a first device pad 216, and a first electrode pad 218 may be connected to a second end of the first through-electrode 215 that is opposite to the first end. The third semiconductor chips 270 may be electrically connected to the first semiconductor chips 210. In exemplary embodiments, each of the third semiconductor chips 270 may include a third device substrate 272, a third passivation layer 274, and third device pads 276. The third device substrate 272 may include a plurality of unit elements. The third passivation layer 274 may protect the unit elements. The unit elements may include, for example, at least one of a memory element, a logic element, or a control element. The third passivation layer 274 may be disposed on the third device substrate 272. The third device pads 276 may penetrate the third passivation layer 274. The third device pads 276 may be connected to the first electrode pads 218. Thus, the third device pads 276 may be electrically connected to the first device pads 216 of the first semiconductor chips 210. A first underfill layer 224 may be disposed between the third device passivation 274 and the first device substrate 212. The first underfill layer 224 may include, for example, a non-conductive film (NCF).

Figure 19:
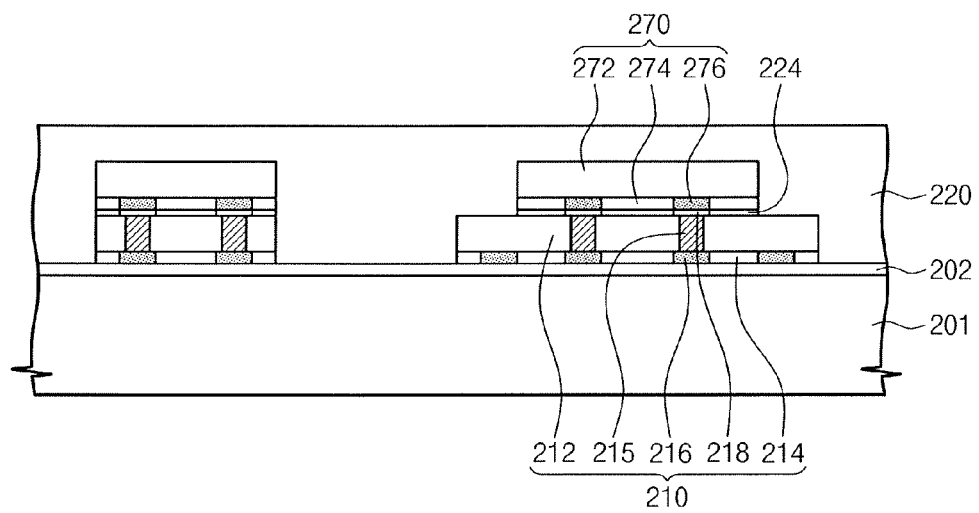

Referring to FIG. 19, a mold substrate 220 may be formed on the separation layer 202, the first semiconductor chips 210, and the third semiconductor chips 270. The mold substrate 220 may fix the first semiconductor chips 210 and the third semiconductor chips 270. Although not shown in the drawings, if the third semiconductor chips 270 are larger than the first semiconductor chips 210, an air gap may be generated between the separation layer 202 and the third semiconductor chips 270. An epoxy molding compound of the mold substrate 220 may not fill the air gap, and thus, the air gap may cause package failures. Thus, according to exemplary embodiments, the third semiconductor chips 270 may be aligned with the first semiconductor chips 210, and the sizes of the third semiconductor chips 270 may be about equal to or less than those of the first semiconductor chips 210.

Figure 20:
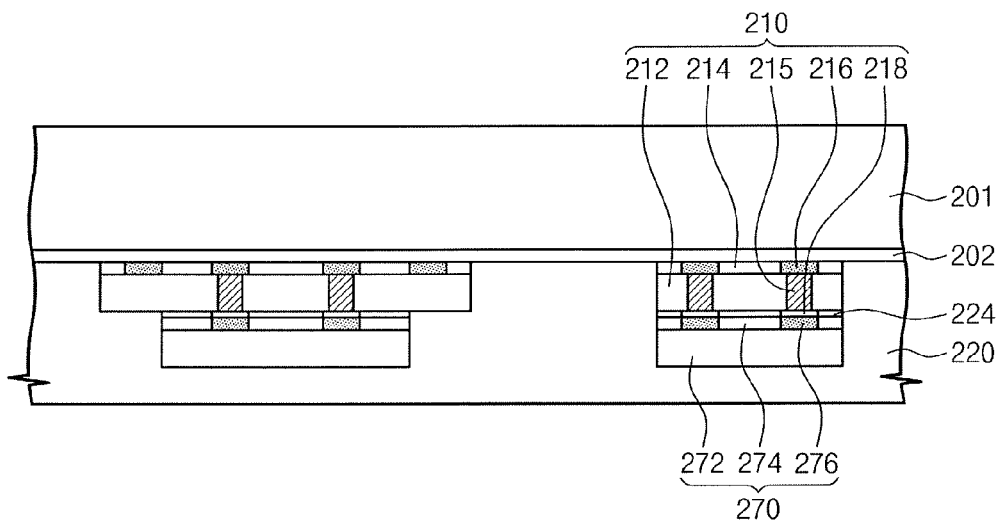

Referring to FIG. 20, the dummy substrate 201 and the mold substrate 220 may be turned over, such that the dummy substrate 201 is disposed on the mold substrate 220.

Figure 21:
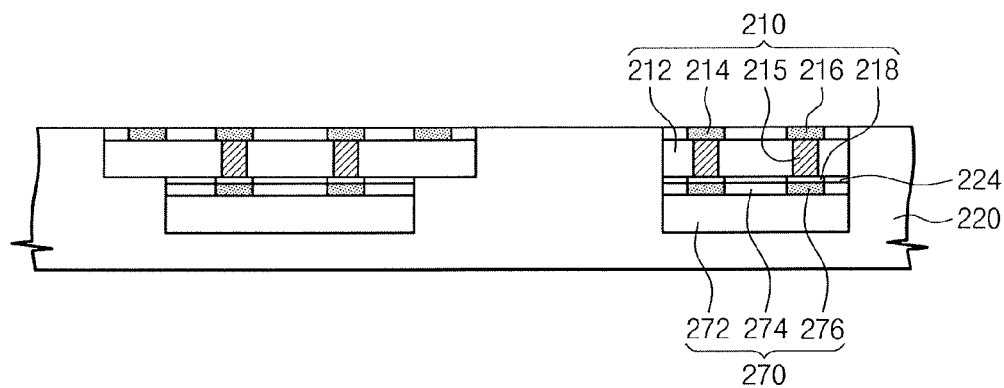

Referring to FIG. 21, the dummy substrate 201 and the separation layer 202 may be removed to expose a portion of the mold substrate 220 and the first semiconductor chips 210.

Figure 22:
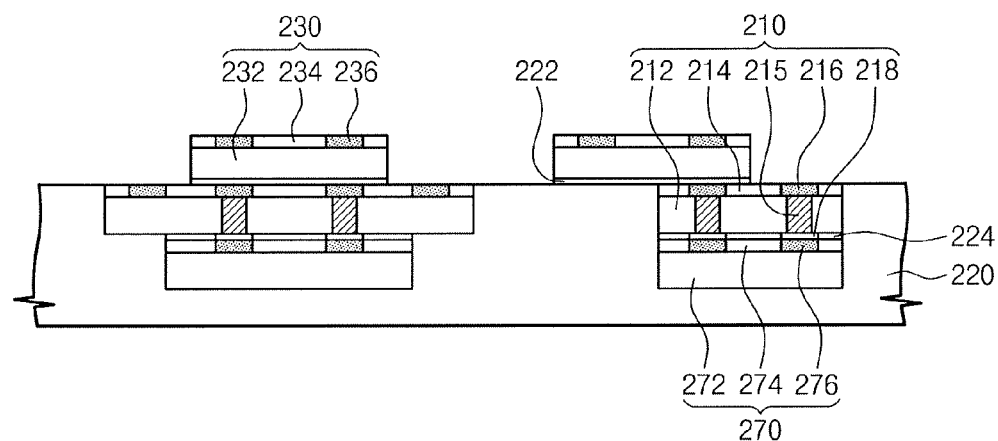

Referring to FIG. 22, second semiconductor chips 230 may be disposed on the first semiconductor chips 210. An adhesive layer 222 may be formed between the second semiconductor chip 230 and the first semiconductor chip 210. The adhesive layer 222 may be formed on one or some of the first device pads 216 as well as on the first passivation layer 214 of the first semiconductor chips 210. According to exemplary embodiments, the respective sizes of chips from among the first semiconductor chips 210, the second semiconductor chips 230, and the third semiconductor chips 270 may be substantially the same or may vary.

Figure 23:
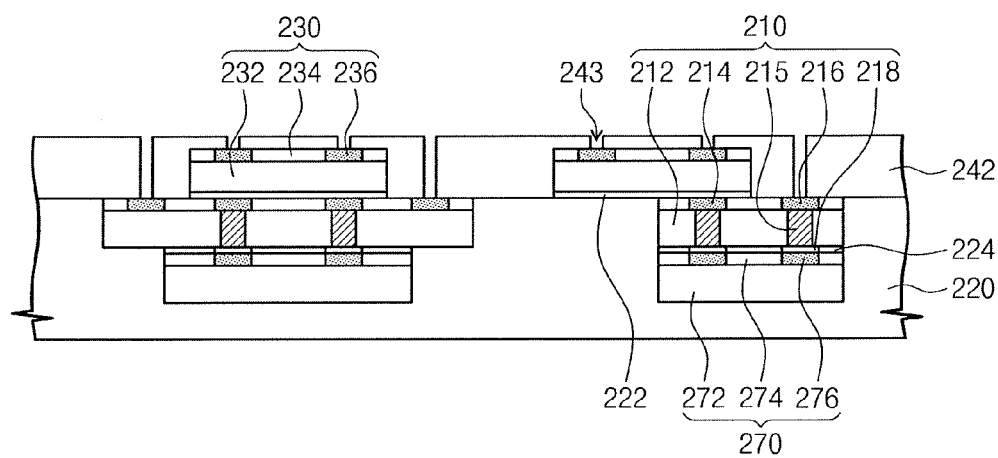

Referring to FIG. 23, a first insulating layer 242 may be formed on the mold substrate 220, the first semiconductor chips 210, and the second semiconductor chips 230. The first insulating layer 242 may have contact holes 243. The contact holes 243 may expose the first device pads 216 of the first semiconductor chips 210 and second device pads 236 of the second semiconductor chips 230. The second semiconductor chips 230 further include a second device substrate 232 and a second passivation layer 234.

Figure 24:
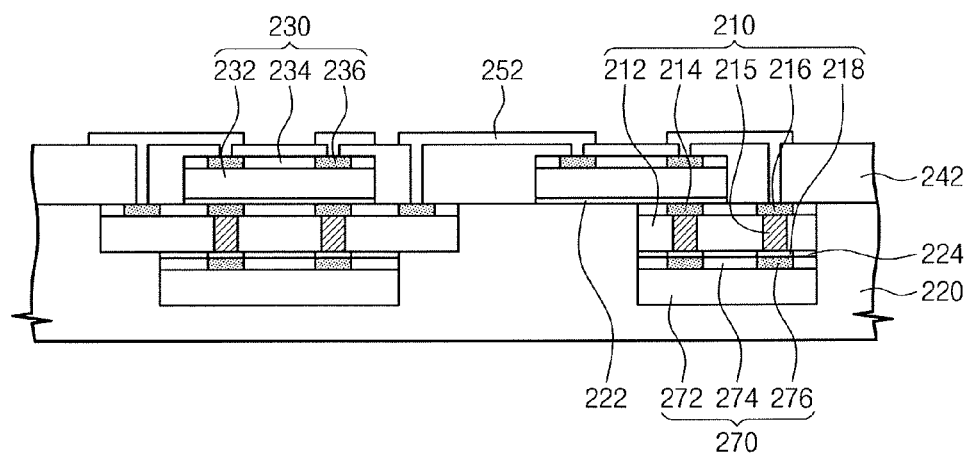

Referring to FIG. 24, first redistribution lines 252 may be formed on portions of the first insulating layer 242, the first device pads 216 of the first semiconductor chips 210, and the second device pads 236 of the second semiconductor chips 230.

Figure 25:
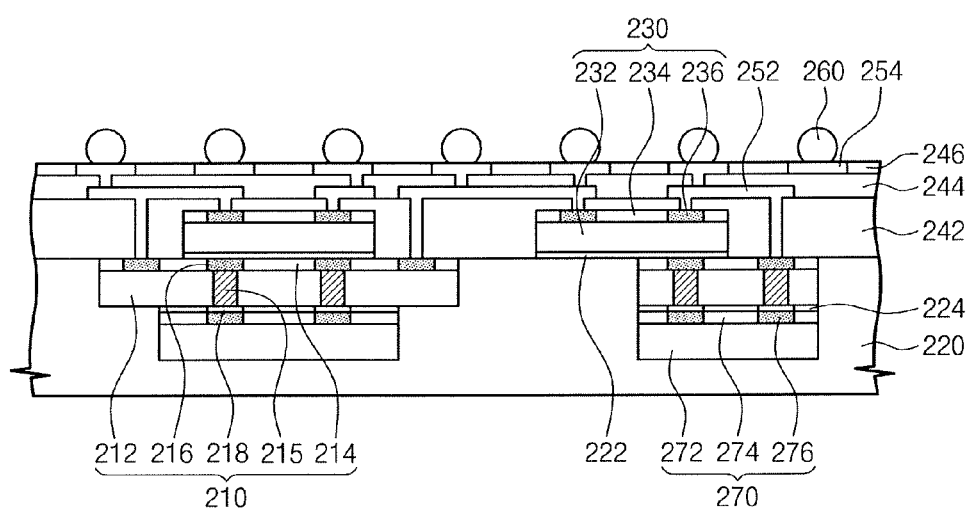

Referring to FIG. 25, a second insulating layer 244, second redistribution lines 254, a package passivation layer 246, and solder balls 260 may be formed on the first redistribution lines 252 and the first insulating layer 242.

FIGS. 26 to 30 are cross-sectional views illustrating a method for fabricating a fan-out wafer level package according to an exemplary embodiment of the present inventive concept. For convenience of explanation, a further description of elements and processes previously described with reference to FIGS. 1 to 25 may be omitted.

Figure 26:
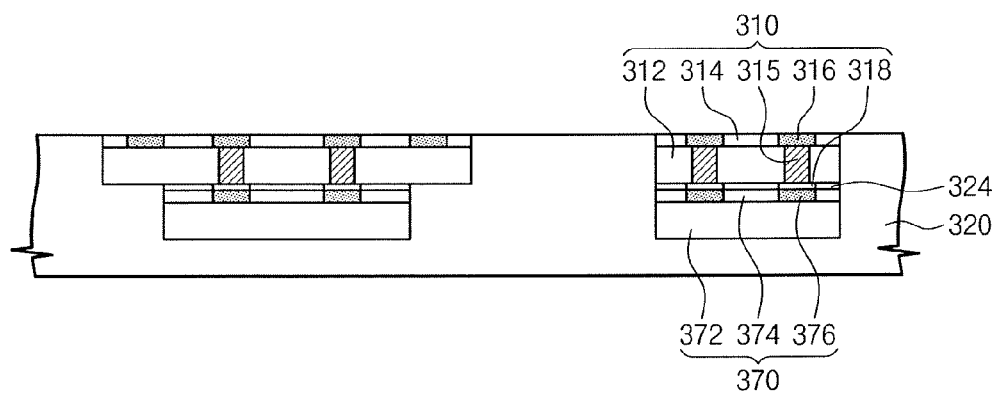
FIGS. 26 to 30 are cross-sectional views illustrating a method for fabricating a fan-out wafer level package according to an exemplary embodiment of the present inventive concept.

Referring to FIGS. 18, 19, and 26, the separation layer 202 may be formed on the dummy substrate 201, and first semiconductor chips 310 and third semiconductor chips 370 may be stacked on the separation layer 202. A mold substrate 320 may be formed on the separation layer 202, the first semiconductor chips 310, and the third semiconductor chips 370, and the dummy substrate 201 and the separation layer 202 may be removed. Each of the first semiconductor chips 310 may include a first device substrate 312, a first passivation layer 314, first device pads 316, first through-electrodes 315, and first electrode pads 318. The first through-electrodes 315 may electrically connect the first device pads 316 to the first electrode pads 318. Each of the third semiconductor chips 370 may include a third device substrate 372, a third passivation layer 374, and third device pads 376. The third device pads 376 may be connected to the first electrode pads 318 of the first semiconductor chips 310. Thus, the first device pads 316 of the first semiconductor chips 310 may be electrically connected to the third device pads 376 of the third semiconductor chips 370. A first underfill layer 324 may be formed between the third passivation layer 374 of the third semiconductor chips 370 and the first device substrate 312 of the first semiconductor chips 310.

Figure 27:
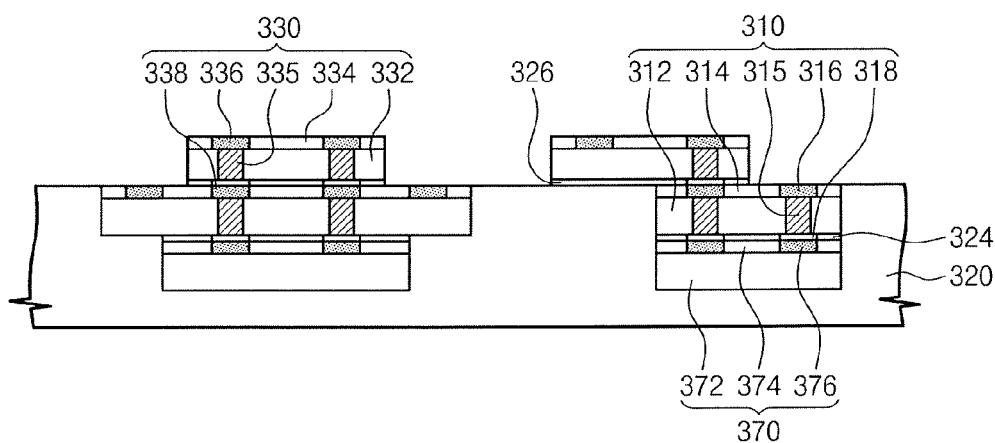

Referring to FIG. 27, second semiconductor chips 330 may be disposed on the first semiconductor chips 310. Each of the second semiconductor chips 330 may include a second device substrate 332, a second passivation layer 334, second device pads 336, second through-electrodes 335, and second electrode pads 338. The second through-electrodes 335 may electrically connect the second device pads 336 to the second electrode pads 338. The second electrode pads 338 may be connected to the first device pads 316 of the first semiconductor chips 310. The second semiconductor chips 330 disposed on the first semiconductor chips 310 may be electrically connected to the third semiconductor chips 370 disposed under the first semiconductor chips 310. A second underfill layer 326 may be formed between the second device substrate 332 of the second semiconductor chips 330 and the first passivation layer 314 of the first semiconductor chips 310.

Figure 28:
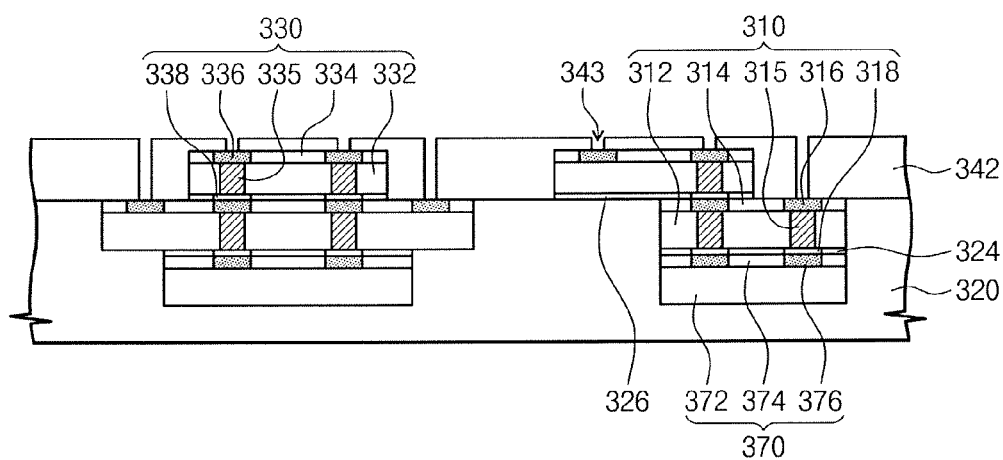

Referring to FIG. 28, a first insulating layer 342 may be formed on the mold substrate 320, the first semiconductor chips 310, and the second semiconductor chips 330. The first insulating layer 342 may have contact holes 343. The contact holes 343 may expose the first device pads 316 of the first semiconductor chips 310 and the second device pads 336 of the second semiconductor chips 330.

Figure 29:
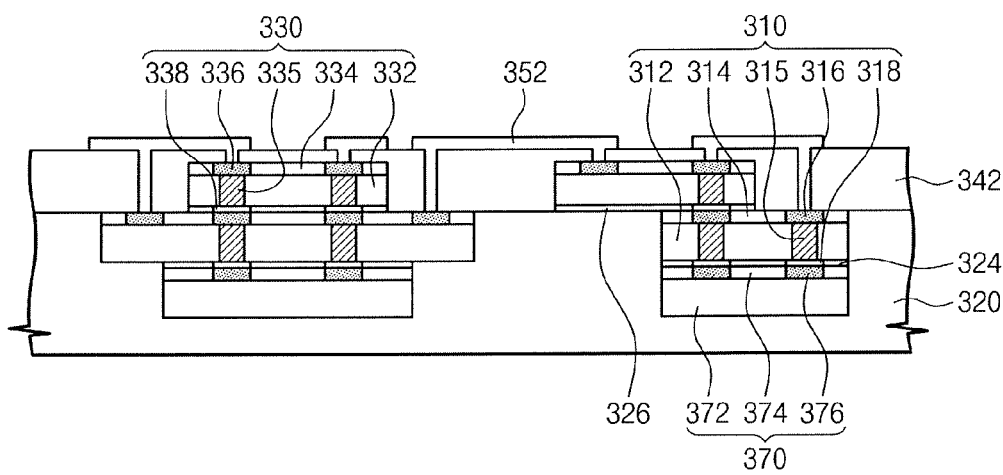

Referring to FIG. 29, first redistribution lines 352 may be formed on portions of the first insulating layer 342, the first device pads 316 of the first semiconductor chips 310, and the second device pads 336 of the second semiconductor chips 330. The first redistribution lines 352 may electrically connect the first device pads 316 to the second device pads 336. Alternatively, one or some of the first redistribution lines 352 may electrically connect the second device pads 336 to each other.

Figure 30:
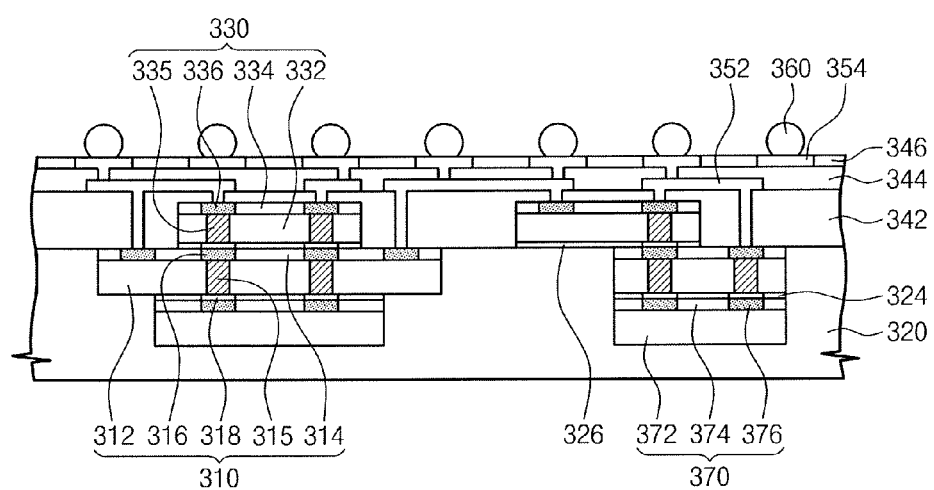

Referring to FIG. 30, a second insulating layer 344, second redistribution lines 354, a package passivation layer 346, and solder balls 360 may be formed on the first insulating layer 342 and the first redistribution lines 352.

In accordance with FIGS. 1 to 30, a method for fabricating a fan-out wafer level package according to exemplary embodiments of the present inventive concept includes disposing a first semiconductor chip on a dummy substrate, forming a mold substrate on the first semiconductor chip and the dummy substrate, removing the dummy substrate to expose the first semiconductor chip, disposing a second semiconductor chip on the exposed first semiconductor chip, forming an insulating layer on the second semiconductor chip, the first semiconductor chip, and the mold substrate, and forming a plurality of redistribution lines. The plurality of redistribution lines electrically connects the first semiconductor chip and the second semiconductor chip through the insulating layer.

Figure 31:
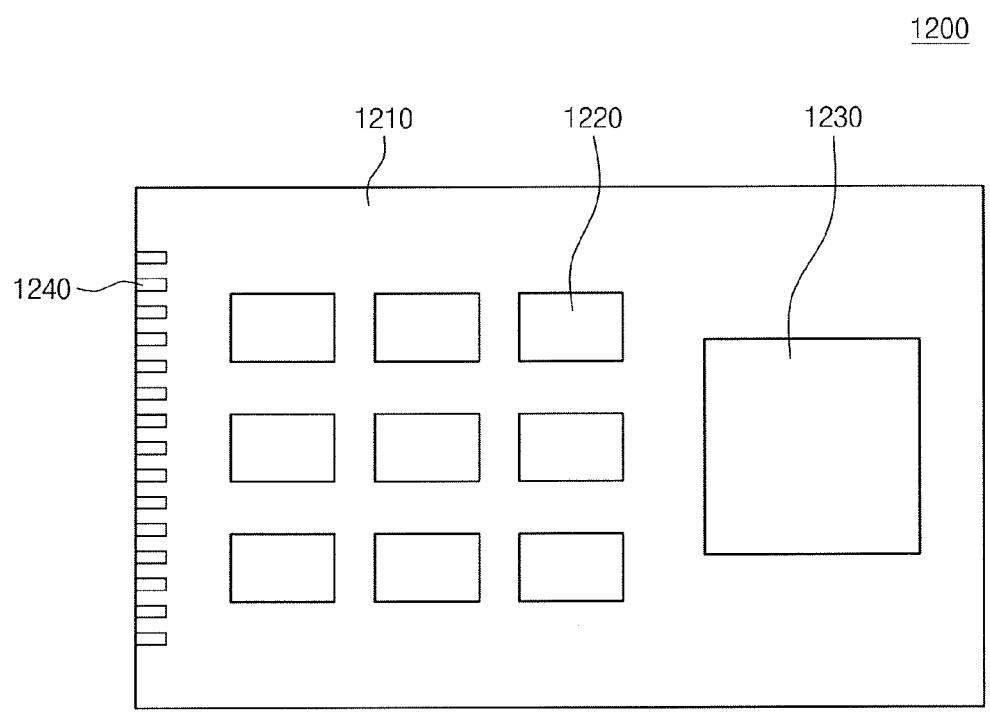
FIG. 31 is a diagram illustrating an exemplary embodiment of a package module including a semiconductor package according to exemplary embodiments of the present inventive concept.

FIG. 31 is a diagram illustrating an exemplary embodiment of a package module including a semiconductor package according to exemplary embodiments of the present inventive concept. Referring to FIG. 31, a package module 1200 may include one or more first semiconductor chips 1220 and a second semiconductor chip 1230 packaged using, for example, a quad flat package (QFP) technique. The semiconductor chips 1220 and 1230 implemented with the semiconductor package technique may be installed on a base substrate 1210 to fabricate the package module 1200. The package module 1200 may be connected to an external electronic device through external connection terminals 1240 provided on a side of the base substrate 1210.

Figure 32:
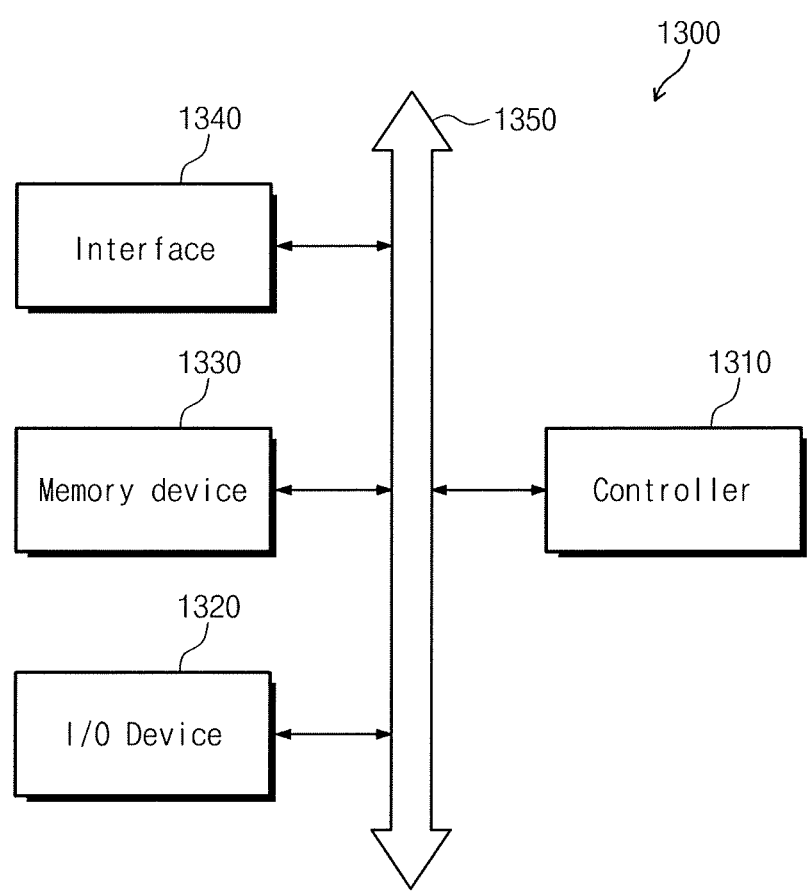
FIG. 32 is a schematic block diagram illustrating an exemplary embodiment of an electronic device including a semiconductor package according to exemplary embodiments of the present inventive concept.

The semiconductor package technique according to the aforementioned exemplary embodiments may be applied to an electronic system. FIG. 32 is a schematic block diagram illustrating an exemplary embodiment of an electronic device including a semiconductor package according to exemplary embodiments of the present inventive concept. Referring to FIG. 32, an electronic system 1300 may include a controller 1310, an input/output (I/O) device 1320, and a memory device 1330. The controller 1310, the I/O device 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. At least one of the controller 1310 and the memory device 1330 may include at least one of the semiconductor packages according to the aforementioned exemplary embodiments of the inventive concept. The I/O device 1320 may include at least one of, for example, a keypad, a keyboard, or a display device. The memory device 1330 is a device configured to store data. The memory device 1330 may store data and/or commands executed by the controller 1310. The memory device 1330 may include at least one of a volatile memory device and a non-volatile memory device. In exemplary embodiments, the memory device 1330 may include a flash memory device. For example, the flash memory device may be implemented according to exemplary embodiments of the inventive concept, and may be installed in an information processing system such as, for example, a mobile device or a desktop computer. The flash memory device may be implemented as, for example, a solid state disk (SSD). In this case, the electronic system 1300 may stably store a large amount of data in the memory device 1330. The electronic system 1300 may further include an interface unit 1340 that transmits electrical data to a communication network or receives electrical data from a communication network. The interface unit 1340 may operate via a wireless connection or a wired connection. Accordingly, the interface unit 1340 may include, for example, an antenna and a transceiver (e.g., a wireless or wired transceiver). The electronic system 1300 may further include, for example, an application chipset and/or a camera image processor (CIS).

The electronic system 1300 may be implemented as, for example, a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing wireless communication, the electronic system 1300 may be used in a communication interface protocol such as, for example, a third generation (3G) communication system (e.g., CDMA, GSM, NADC, E-TDMA, WCDMA, CDMA2000) or a fourth generation (4G) communication system (e.g., LTE).

Exemplary embodiments of the present inventive concept may be applied to a memory card.

Figure 33:
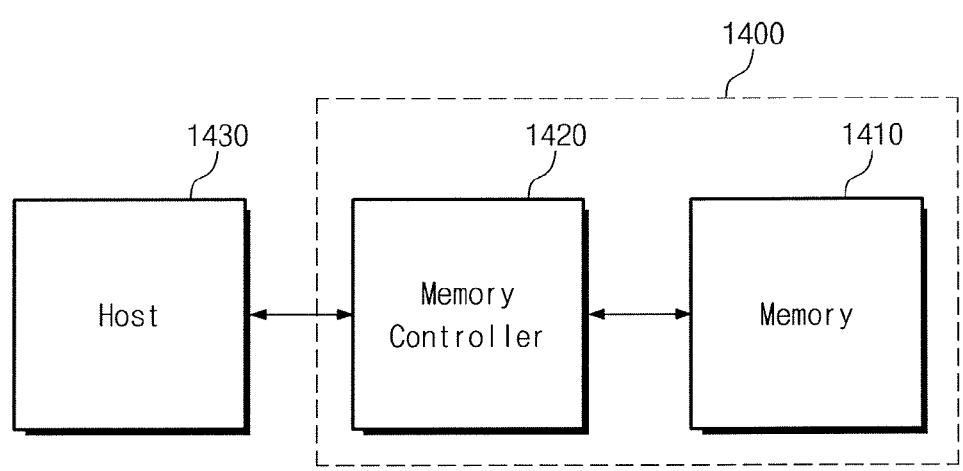
FIG. 33 is a schematic block diagram illustrating an exemplary embodiment of a memory system including a semiconductor package according to exemplary embodiments of the present inventive concept.

FIG. 33 is a schematic block diagram illustrating an exemplary embodiment of a memory card including a semiconductor package according to exemplary embodiments of the present inventive concept. Referring to FIG. 33, a memory card 1400 may include a non-volatile memory device 1410 and a memory controller 1420. The non-volatile memory device 1410 and the memory controller 1420 may store data or may read stored data. At least one of the memory device 1410 and the memory controller 1420 may include at least one of the semiconductor packages according to the aforementioned exemplary embodiments of the present inventive concept. The memory controller 1420 may read data from and store data in the non-volatile memory device 1410 in response to a read/write request of a host 1430.

According to exemplary embodiments of the present inventive concept, as described above, a fabricating method may include forming the mold substrate under the first semiconductor chip, and sequentially forming the second semiconductor chip and the insulating layer on the first semiconductor chip and the mold substrate. The mold substrate, the first and second semiconductor chips, and the insulating layer may be implemented as a multi-chip having a reduced thickness (e.g., a minimized thickness) and a reduced size (e.g., a minimized).

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method for fabricating a fan-out wafer level package, comprising:

disposing a first semiconductor chip on a dummy substrate;

forming a mold substrate on the first semiconductor chip and the dummy substrate;

removing the dummy substrate to expose the first semiconductor chip;

disposing a second semiconductor chip on the exposed first semiconductor chip;

forming an insulating layer on the second semiconductor chip, the first semiconductor chip, and the mold substrate; and forming a plurality of redistribution lines, wherein the plurality of redistribution lines electrically connects the first semiconductor chip and the second semiconductor chip through the insulating layer, wherein the insulating layer comprises a plurality of contact holes exposing a portion of the first semiconductor chip and a portion of the second semiconductor chip, wherein a portion of the redistribution lines connects to the first semiconductor chip through one of the contact holes that extends through the insulating layer in an area that is adjacent to a side surface of the second semiconductor chip and that overlaps the first semiconductor chip.

2. The method of claim 1, further comprising:

forming a separation layer on the dummy substrate, wherein removing the dummy substrate comprises removing the separation layer from the mold substrate and the first semiconductor chip.

3. The method of claim 2, Wherein the separation layer comprises a temporary adhesive, and the method further comprises:

heating the temporary adhesive to separate the temporary adhesive from the first semiconductor chip and the mold substrate.

4. The method of claim 2, wherein the first semiconductor chip comprises:

a first device substrate;

a first passivation layer disposed on the first device substrate; and a plurality of first device pads connected to the first device substrate and exposed through the first passivation layer, wherein the separation layer is temporarily adhered to the plurality of first device pads and the first passivation layer.

5. The method of claim 4, further comprising:
disposing an adhesive layer between the second semiconductor chip and the first passivation layer.

6. The method of claim 4, wherein the first semiconductor chip comprises a first through-electrode and a first electrode pad, and the method further comprises:
forming a third semiconductor chip aligned with the first electrode pad,
wherein a first end of the first through-electrode is connected to one of the plurality of first device pads, the first through-electrode penetrates the first device substrate, and the first electrode pad is connected to a second end of the first through-electrode that is opposite to the first end.

7. The method of claim 6, wherein the third semiconductor chip comprises a third device substrate, a third passivation layer, and a third device pad, and the method further comprises:
forming a first underfill layer between the third passivation layer and the first device substrate,
wherein the third passivation layer is disposed on the third device substrate, and the third device pad penetrates the third passivation layer and electrically connects the third device substrate to the first electrode pad.

8. The method of claim 4, wherein the second semiconductor chip comprises a second device substrate, a second passivation layer, a plurality of second device pads, a second through-electrode, and a second electrode pad, wherein the method further comprises:
forming an underfill layer between the first passivation layer and the second device substrate,
wherein the second passivation layer is disposed on the second device substrate, the plurality of second device pads is connected to the second device substrate and exposed through the second passivation layer, a first end of the second through-electrode is connected to one of the plurality of second device pads, the second through-electrode penetrates the second device substrate, the second electrode pad is electrically connected to a second end of the second through-electrode that is opposite to the first end, and the second electrode pad electrically connects the second through-electrode to the first device pad.

9. A method for fabricating a fan-out wafer level package, comprising:
forming a separation layer on a dummy substrate;
disposing a first semiconductor chip on the separation layer;
forming an additional semiconductor chip on the first semiconductor chip;
forming a mold substrate on the first semiconductor chip, the additional semiconductor chip, and the dummy substrate;
removing the dummy substrate to expose the first semiconductor chip, wherein removing the dummy substrate comprises removing the separation layer from the mold substrate, the first semiconductor chip, and the additional semiconductor chip;

disposing a second semiconductor chip on the exposed first semiconductor chip;
forming an insulating layer on the second semiconductor chip, the first semiconductor chip, and the mold substrate; and
forming a plurality of redistribution lines, wherein the plurality of redistribution lines electrically connects the first semiconductor chip and the second semiconductor chip through the insulating layer,
wherein the first semiconductor chip comprises:
a first device substrate;
a first passivation layer disposed on the first device substrate;
a plurality of first device pads connected to the first device substrate and exposed through the first passivation layer;
a first through-electrode disposed in the first device substrate; and
a first electrode pad disposed on the first through-electrode,
wherein the separation layer is temporarily adhered to the plurality of first device pads and the first passivation layer,
wherein a first end of the first through-electrode is connected to one of the plurality of first device pads, and the first electrode pad is connected to a second end of the first through-electrode that is opposite to the first end.

10. The method of claim 9, wherein the separation layer comprises a temporary adhesive, and the method further comprises:
heating the temporary adhesive to separate the temporary adhesive from the first semiconductor chip and the mold substrate.

11. The method of claim 9, further comprising:
disposing an adhesive layer between the second semiconductor chip and the first passivation layer.

12. The method of claim 9, wherein the second semiconductor chip comprises a second device substrate, a second passivation layer, a plurality of second device pads, a second through-electrode, and a second electrode pad, wherein the method further comprises:
forming an underfill layer between the first passivation layer and the second device substrate,
wherein the second passivation layer is disposed on the second device substrate, the plurality of second device pads is connected to the second device substrate and exposed through the second passivation layer, a first end of the second through-electrode is connected to one of the plurality of second device pads, the second through-electrode penetrates the second device substrate, the second electrode pad is electrically connected to a second end of the second through-electrode that is opposite to the first end, and the second electrode pad electrically connects the second through-electrode to the first device pad.

13. A method for fabricating a fan-out wafer level package, comprising:
disposing a first semiconductor chip on a dummy substrate, wherein the first semiconductor chip comprises a first device substrate, a first device pad disposed on the first device substrate, a first through-electrode disposed in the device substrate, and a first electrode pad disposed on the first through-electrode and the first device substrate;

forming an additional semiconductor chip on the first semiconductor chip, wherein the additional semiconductor chip is connected to the first electrode pad;

forming a mold substrate on the first semiconductor chip and the dummy substrate;

removing the dummy substrate to expose the first semiconductor chip;

disposing a second semiconductor chip on the exposed first semiconductor chip;

forming an insulating layer on the second semiconductor chip, the first semiconductor chip, and the mold substrate; and forming a plurality of redistribution lines, wherein the plurality of redistribution lines electrically connects the first semiconductor chip and the second semiconductor chip through the insulating layer, wherein a first end of the first through-electrode is connected to the first device pad, and the first electrode pad is connected to a second end of the first through-electrode that is opposite to the first end.

14. The method of claim 13, further comprising:
forming a separation layer on the dummy substrate, wherein removing the dummy substrate comprises removing the separation layer from the mold substrate and the first semiconductor chip.

15. The method of claim 14 wherein the separation layer comprises a temporary adhesive, and the method further comprises:
heating the temporary adhesive to separate the temporary adhesive from the first semiconductor chip and the mold substrate.

16. The method of claim 14, wherein the first semiconductor chip further comprises:
a first passivation layer disposed on the first device substrate,
wherein the first device pad is connected to the first device substrate and exposed through the first passivation layer, and the separation :layer is temporarily adhered to the first device pad and the first passivation layer.

17. The method of claim 16, further comprising:
disposing an adhesive layer between the second semiconductor chip and the first passivation layer.

18. The method of claim 13, wherein the second semiconductor chip comprises a second device substrate, a second passivation layer, a second device pad, a second through-electrode, and a second electrode pad, wherein the method further comprises:
forming an underfill layer between a first passivation layer of the first semiconductor chip and the second device substrate,
wherein the second passivation layer is disposed on the second device substrate, the second device pad is connected to the second device substrate and exposed through the second passivation layer, a first end of the second through-electrode is connected to the second device pad, the second through-electrode penetrates the second device substrate, the second electrode pad is electrically connected to a second end of the second through-electrode that is opposite to the first end, and the second electrode pad electrically connects the second through-electrode to the first device pad.

* * * * *